United States Patent
Lewis et al.

(10) Patent No.: US 7,236,633 B1
(45) Date of Patent: Jun. 26, 2007

(54) DATA COMPRESSION AND DECOMPRESSION TECHNIQUES FOR PROGRAMMABLE CIRCUITS

(75) Inventors: David Lewis, Toronto (CA); Paul Leventis, Toronto (CA)

(73) Assignee: Altera Corporation, San Jose, CA (US)

( * ) Notice: Subject to any disclaimer, the term of this patent is extended or adjusted under 35 U.S.C. 154(b) by 732 days.

(21) Appl. No.: 10/394,472

(22) Filed: Mar. 21, 2003

(51) Int. Cl.
G06K 9/36 (2006.01)
G06K 9/46 (2006.01)

(52) U.S. Cl. .................................................. 382/233

(58) Field of Classification Search ................ 382/233, 382/247; 341/107
See application file for complete search history.

(56) References Cited

U.S. PATENT DOCUMENTS

| | | | | |
|---|---|---|---|---|
| 5,563,592 A * | 10/1996 | Cliff et al. | ..................... | 341/63 |
| 5,655,032 A * | 8/1997 | Ohsawa et al. | ............. | 382/238 |
| 5,745,734 A * | 4/1998 | Craft et al. | .................... | 716/16 |
| 5,784,497 A * | 7/1998 | Ishizuka et al. | ............ | 382/247 |
| 6,327,634 B1* | 12/2001 | Statovici | ...................... | 710/74 |
| 6,563,437 B1* | 5/2003 | Landry et al. | ................ | 341/51 |

OTHER PUBLICATIONS

"Arithmetic coding," <http://www.rasip.fer.hr/research/compress/algorithms/fund/ac/> visited on Jul. 18, 2002, 8 pages total.
Campos, A.S.E. (1999)."'Arithmetic coding' by Arturo San Emeterio Campos" <http://www.arturocampos.com/ac_arithmetic.html> visited on Jul. 18, 2002, 8 pages total.
Witten, I.H. et al. (1987). "Arithmetic Coding for Data Compression," Communications of the ACM, 30(8):520-540.
"Configuration Devices Advanced Features," <http://www.altera.com/products/devices/config/features/cfg-adv_features.html#data> visited on Dec. 12, 2002, 4 pages total.
"Enhanced Configuration Devices (EPC4, EPC8 & EPC16) Apr. 2002, ver. 2.0 Data Sheet," <http://www.altera.com/literature/ds/dsepc16.pdf>, 36 pages total.

* cited by examiner

*Primary Examiner*—Phuoc Tran
(74) *Attorney, Agent, or Firm*—Townsend and Townsend and Crew LLP

(57) ABSTRACT

The present invention provides techniques for compressing and decompressing data in a programmable circuit. Programmable circuits can be configured according to user design by configuration data. Configuration data is compressed using a compression algorithm to save memory space. When the configuration data is needed, the compressed configuration data is decompressed using a decompressor. A decompressor can decompress configuration data using a variety of decompression algorithms such as arithmetic decoding. In an arithmetic encoding algorithm, symbol probabilities are used to increase compression of the data. The symbol probabilities can be transferred in a header of the encoded data stream and subsequently stored in a symbol probability table. The input of the decompressor may be coupled to a FIFO that temporarily stores the encoded data until it can be used by the decompressor.

22 Claims, 5 Drawing Sheets

DATA COMPRESSION AND DECOMPRESSION TECHNIQUES FOR PROGRAMMABLE CIRCUITS

REFERENCE TO A COMPUTER PROGRAM LISTING APPENDIX SUBMITTED ON A COMPACT DISK

This application contains an appendix consisting of a computer program listing of more than 300 lines. The computer listing is provided on a single CD-R and is accompanied by a duplicate copy (two CD-R in total). The material contained on the CD-R is hereby incorporated herein by reference and consists of one file, titled "Computer Program Listing Appendix_v1.doc," created on Mar. 21, 2003, and comprising 104 kbytes.

BACKGROUND OF THE INVENTION

The present invention relates for data compression and decompression techniques for programmable circuits, and more particularly, to techniques for reducing the size of data used to configure programmable circuits using data compression and decompression.

In many applications, it is desirable to reduce the size of a particular quantity of data. Reducing the size of data saves memory space. In data transmission applications, it is desirable to reduce the size of data to reduce bandwidth requirements associated with a data transmission system.

The size of data can be reduced by compressing the data using data compression techniques. Compressed data can be converted back into the original data using data decompression techniques.

Data can be compressed using a variety of data compression techniques. For example, data can be compressed using an arithmetic coding. Data can also be compressed using Huffman coding. These two techniques are well known in the art of data compression.

Altera's EPC16 is a prior art system that uses data decompression. The EPC16 decompresses compressed configuration data before sending the data to a programmable logic device configuration unit.

According to the EPC16 system, each 16-bit word of input data is compressed into 4-bit nibbles that equal each non-zero set of 4 input bits plus a final 4-bit nibble. If the first set of 4-bits in an input 16-bit word are all zeros, the compressor outputs a zero as the first bit in the final output 4-bit nibble. If the first set of 4 input bits includes a one, the compressor outputs a one as the first bit in the final 4-bit nibble, and the compressor outputs the first set of 4 input bits as the first output 4-bit nibble.

If the second set of 4-bits in an input 16-bit word are all zeros, the compressor outputs a zero as the second bit in the final output 4-bit nibble. If the second set of 4 input bits includes a one, the compressor outputs a one as the second bit in the final output 4-bit nibble, and the compressor outputs the second set of 4 input bits as the first or second output 4-bit nibble. This process repeats for each subsequent set of 4 bits in the input 16-bit word.

If all 4 sets of 4 bits in an input 16-bit word are non-zero, the EPC16 compression system outputs 20 bits. If 3 of the 4 sets of 4 bits in an input 16-bit word are non-zero, the EPC16 compression system outputs 16 bits.

Thus, for some sets of input data, the EPC16 compression system does not reduce the number of output bits relative to the corresponding number of input bits. This is a significant disadvantage of the EPC16 compression system.

The EPC16 system does not use parameters to increase compression of the data. The compressed data is decompressed by reversing the compression process.

It would therefore be desirable to increase the data compression of configuration data for programmable circuits by using parameters that are selected based on properties of the configuration data.

BRIEF SUMMARY OF THE INVENTION

The present invention provides techniques for compressing and decompressing digital data that is used to configure a programmable circuit. Programmable circuits that are configured with digital configuration data include programmable logic devices (PLDs), field programmable gate arrays (FPGAs), programmable logic arrays (PLAs), programmable gate arrays, and programmable analog circuits. Programmable circuits are typically programmable integrated circuits.

Programmable circuits can be configured according to a user design by configuration data. The configuration data is used program programmable circuit elements in a programmable integrated circuit.

Configuration data is compressed using a compression algorithm to save memory space. The configuration is then stored for later use. When the configuration data is needed, the compressed configuration data is accessed from memory and decompressed using a decompressor. The decompressed configuration data can be used to configure a programmable circuit.

According to the present invention, configuration data is compressed and decompressed using parameters that increase compression of the configuration data. By increasing the compression of the data, the amount of memory space needed to the store the configuration data is reduced. In one embodiment of the present invention, symbol probabilities are used to increase compression of the data. The symbol probabilities represent the likelihood of receiving a particular symbol in an uncompressed or decompressed data stream given a set of recently generated symbols.

The compression algorithm generates probabilities for each symbol in the configuration data. The compression algorithm then compresses the configuration data using the symbol probabilities. The symbol probabilities are stored in a header that is attached to the configuration data bitstream.

When the compressed data is supplied to a decompressor, the decompressor accesses the symbol probabilities in the header and stores them in a symbol probability table. The configuration data is then decompressed using the symbol probabilities stored in the table according to the decompression algorithm.

According to an embodiment of the present invention, the compressed configuration data can be stored in a first-in-first-out (FIFO) buffer until it is provided to the decompressor. The decompressor outputs more decompressed symbols than the compressed symbols it receives. The FIFO allows the data rate between the input and output of the decompressor to vary without pausing the input data stream.

Other objects, features, and advantages of the present invention will become apparent upon consideration of the following detailed description and the accompanying drawings, in which like reference designations represent like features throughout the figures.

DETAILED DESCRIPTION OF THE INVENTION

Figure 1:
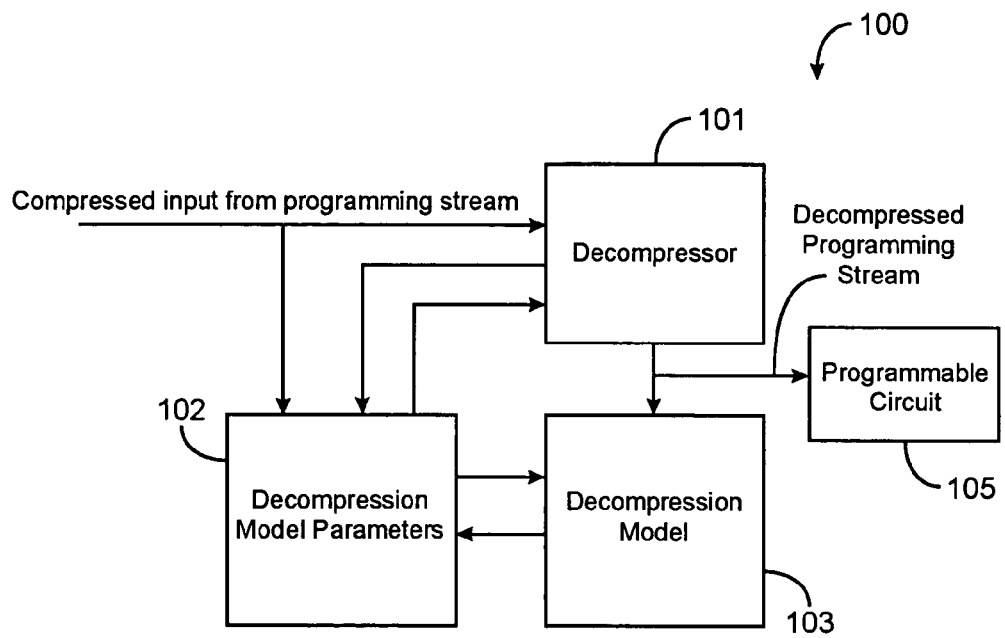
FIG. 1 illustrates a block diagram of a data decompression system according to the present invention.

Programmable integrated circuits contain numerous programmable circuit elements that can be configured to perform various functions. For example, SRAM based programmable logic devices (PLDs) include numerous programmable logic elements and programmable interconnect resources. Programmable logic elements can be programmed to perform logic functions such as an AND function.

The programmable circuit elements can be configured to perform various functions by configuration data. The configuration data is loaded into the programmable circuit to configure the programmable elements to perform particular functions.

The configuration data can, for example, be stored in memory that is external or internal to the PLD. The configuration data can also be generated by some other external device such as a processor or a communication link. In any of these examples, a significant cost is associated with the storage of the configuration data. This is especially true for where a read-only memory (ROM) is dedicated to the storage of the configuration data. Reducing the size of the configuration data leads to a direct reduction in the cost of the memory required and a significant cost savings.

According to the principles of the present invention, configuration data for a programmable circuit can be compressed and decompressed using any suitable compression and decompression algorithms. Configuration data for PLDs typically has properties that make it amenable to compression and the reduction of the data size.

These properties include the fact that the configuration data may have a highly predictable ratio of 0 s to 1 s. The predictable nature of the configuration data is based on the internal logic structure of the programmable circuit. For example, if some of the programmable circuit elements in a PLD are not used in a design, corresponding parts of the configuration data are set to a default value (e.g., 0).

The present invention is discussed primarily in the context of programmable logic devices (PLDs). However, it should be understood that the discussion of PLDs is not intended to limit the scope of the present invention. PLDs are merely one example of circuits that can be used with principles of the present invention. The present invention also applies to other types of programmable circuits that are configured using digital data such as field programmable gate arrays (FPGAs), programmable logic arrays, and programmable analog circuits.

Configuration data is conventionally viewed as a sequence of symbols. The symbols are serially loaded into the PLD. The symbols are data bits used to configure the PLD. Other representations are also possible. For example, a group of data bits can be viewed as one or more symbols.

The configuration data may include binary bits in a serial data stream. In other embodiments of the present invention, the configuration data includes higher order symbol alphabets such as octal, decimal, and hexadecimal numbers.

Data compression algorithms encode data to reduce its size. Data decompression algorithms decode compressed data to restore the compressed data to its original uncompressed form.

Data compression and decompression algorithms of the present invention operate by using a model of particular properties of the configuration data. A model is an algorithm that determines some of the parameters for the encoding and decoding at each point in the decoding process.

Data compression and decompression algorithms of the present invention use parameters to increase compression of the configuration data. Parameters are values that are selected based on properties of the configuration data. The parameters can be selected based on properties that vary with each unique set of configuration data. The parameters are distinct from the data itself.

For example, symbol probabilities are parameters that are used by some data compression models. A symbol probability represents the probability that a particular symbol will be seen in a stream of uncompressed (or decoded) input data based on some property of the input data stream, such as a recently received set (or history) of symbols in the uncompressed input data stream.

A compression algorithm uses symbol probabilities to increase compression of uncompressed input data. Arithmetic encoding and Huffman encoding are examples of data compression algorithm that uses symbol probabilities.

According to one embodiment of the present invention, the probability of each symbol appearing in a decoded data stream is stored in a table. The table is indexed by the most recent history of symbols in the data stream. This technique gives the probability of seeing an input symbol in the data stream as a function of previously received input symbols.

A set of parameters can be computed for each set of data. This set of parameters can be used to compress and decompress that set of data.

For example, if the parameters used by the compression algorithm are symbol probabilities, the symbol probabilities can be computed for each set of configuration data. Computing parameters for each set of configuration data increases data compression, because it increases the accuracy of the symbol probabilities.

According to the present invention, data compression models can be static or dynamic. A static model implements a function of parameters that do not change during the input data stream. For example, a static model may use fixed symbol probabilities. The fixed symbol probabilities remain constant while the input data is processed.

A dynamic model implements a function that changes while the input data is processed. For example, a dynamic model may use variable symbol probabilities that are adjusted according to statistical properties of the input or the output data at various points in the data.

For example, the probability of a 0 for each symbol history may be initialized to 0.5. The probability of a 0 is then increased or decreased based on the symbol that is compressed in each cycle. If a 0 is compressed in the current cycle, the probably of seeing a 0 in the next bit is increased above 0.5.

The present invention provides techniques for compressing and decompressing configuration data for a programmable circuit. The input data stream may include the configuration data and model compression parameters.

One embodiment of the present invention is an arithmetic encoder that uses a compression model with symbol probabilities. The arithmetic encoder may use a static model that gives symbol probabilities as a function of a fixed length history of symbols. Alternatively, a dynamic model of symbol probabilities may be used.

FIG. 1 illustrates a high level block diagram of a data decompression system 100 according to an embodiment of the present invention. Data decompression system 100 includes decompressor 101, decompression model parameters 102, and decompression model 103. Data decompression system 100 receives an input stream of compressed configuration data.

Decompressor 101 decompresses the compressed data received on the input data stream. Decompressor 101 outputs a programming stream of decompressed configuration data. The decompressed configuration data can be used to configure a programmable circuit 105 such as a programmable logic device (PLD), an FPGA, a PLA, or a programmable analog circuit.

The compressed input data stream includes compressed configuration data and compression model parameters. In one embodiment of the present invention, the compression model parameters are contained in a header of the data stream. The header can be a fixed length portion of the compressed input stream that precedes the configuration data.

The header can contain the probabilities of each decompressed symbol for every possible combination of previous decompressed output symbols of a fixed length. For example, the header can store the probability that the next decompressed symbol is a "0" given a recent history of 0110 in the decompressed output data stream.

The decompression model parameters 102 also receive the compressed data input stream as shown in FIG. 1. Decompression model parameters 102 store the compression model parameters that are in the compressed data stream. For example, decompression model parameters 102 can load the symbol probabilities from the header of the compressed data stream into memory. The symbol probabilities can be loaded once at the beginning of the compressed input data stream, or periodically throughout the compressed input data stream.

Decompressor 101 communicates with decompression model parameters 102 to receive the parameters required to decompress data in the compressed input stream. For example, decompressor 101 can access the symbol probabilities from decompression model parameters 102.

Decompression model 103 receives the decompressed data stream output of decompressor 101. Decompression model 103 can be a dynamic decompression model or a static decompression model. If decompression model 103 is dynamic, decompression model 103 updates decompression model parameters 102 to reflect the current state of the decompressed output data.

For example, decompression model 103 can update the symbol probabilities in decompression model parameters 102 based on recent symbols in the decompressed output data stream. Decompression model 103 then access the updated symbol probabilities from decompression model parameters 102 based on recent symbols in the decompressed output data stream.

If decompression model 103 is a static model, decompression model 103 accesses decompression model parameters 102 based on a recent history of the decompressed output data, but does not update the parameters. For example, decompression model 103 can access the symbol probabilities in decompression model parameters 102 based on recent symbols in the decompressed output data stream.

Figure 2:
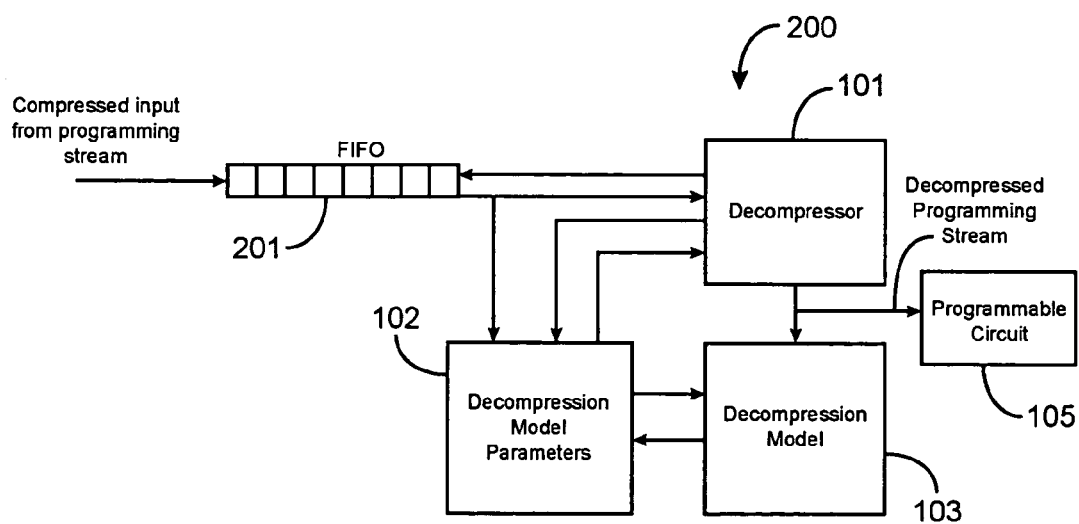
FIG. 2 illustrates a data decompression system with a first-in-first-out buffer according to the present invention.

FIG. 2 illustrates a block diagram of a second embodiment of a data decompression system 200 of the present invention. Data decompression system 200 includes first-in-first-out (FIFO) buffer 201. FIFO 201 is coupled between the compressed data input stream and a data input of decompressor 101 and an input of decompression model parameters 102. FIFO 201 stores the symbols in the compressed data input stream before the symbols are passed to decompressor 101.

As discussed above, the size of data is reduced when it is compressed. For example, five bits of data may be compressed into three bits. Decompressor 101 takes compressed data and converts it back into its original uncompressed form. Decompressor 101 typically outputs more decompressed symbols than the number of compressed input symbols it receives.

Decompressor 101 is typically operated at a faster data rate than the compressed data input stream. The faster data rate of decompressor 101 helps to accommodate for the fact that decompressor 101 outputs more symbols than it receives. The data rate of the decompression system is typically chosen to be fast enough so that it can deliver output data at a sufficient data rate to consume input data at a continuously sustained rate.

However, some decompression algorithms have a variable rate between input and output data. For example, a first compressed symbol may correspond to 2 decompressed symbols, and a second compressed symbol may correspond to 4 decompressed symbols. Because of these variations, there may be short periods in which the decompression algorithm produces one or more output symbols without consuming any input symbols. Therefore, decompressor 101 at times may not be able to consume every input symbol when it is received.

FIFO 201 is a first-in-first-out shift register that temporarily stores symbols in the compressed data input stream. Decompressor 101 cannot consume the next symbol in the compressed data input stream when it is still decompressing the previously received symbol. When decompressor 101 cannot decompress the next compressed input symbol, that symbol continues to be stored in FIFO 201.

FIFO 201 continues to store a symbol in the compressed data input stream, until decompressor 101 can decompress that symbol. FIFO 201 can store many compressed input symbols at the same time. The first symbol stored in FIFO 201 is provided to decompressor 101 when decompressor 101 is ready to consume the next symbol. Because buffer 201 is a first-in-first-out buffer, it maintains the order of the symbols in the compressed data input stream.

FIFO 201 allows decompressor 101 to continuously accept data without the need to pause the compressed data input stream. FIFO 201 eliminates the need to provide signals, logic circuits, or any other communication to the PLD to pause the compressed data input stream. Input data is merely stored in FIFO 201 until it can be used by decompressor 101.

The number of memory spaces in FIFO 201 is chosen so that FIFO 201 can store all of the input symbols that can cannot be consumed by decompressor 101 in the worst case of the decompression algorithm. The maximum number of input symbols that need to be stored in FIFO 201 at one time depends on the particular decompression algorithm.

A variety of means are available to operate FIFO 201 and decompressor 101 at different data rates. For example, FIFO 201 may be an asynchronous FIFO. As another example, FIFO 201 may be constructed of synchronous logic clocked at the higher clock rate using control logic to enable reading and writing at appropriate cycles at the lower clock rate.

Figure 3:
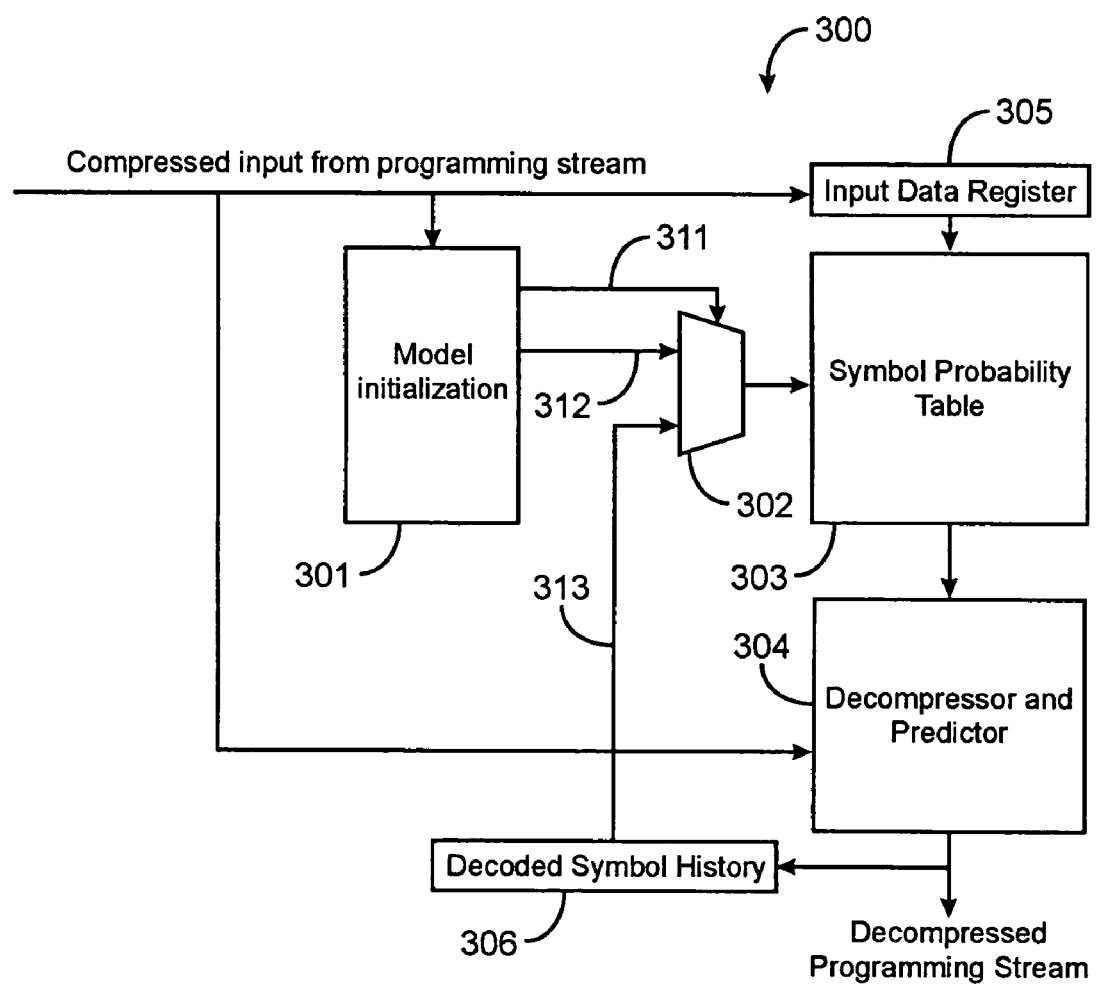
FIG. 3 illustrates further details of a data decompression system according to the present invention.

FIG. 3 illustrates a specific example of decompression system 100 shown in FIG. 1. Decompression system 300 in FIG. 3 includes model initialization block 301, multiplexer 302, input data shift register 305, symbol probability table 303, decompressor and predictor 304, and decoded symbol history shift register 306.

The compressed data input stream includes a header that contains symbol probabilities for every possible fixed length recent history of the decompressed output symbols. In an alternate embodiment of the present invention, the compressed data input stream includes a header that contains symbol probabilities for a set of variable length recent histories of the decompressed output symbols.

The header is followed by compressed data symbols that represent compressed configuration data for a programmable circuit. The compressed data symbols may be, for example, binary bits.

The symbol probabilities in the header are initially stored in input data shift register 305. The header is typically a fixed length. For example, the header may include 16 words, each word having 4 bits, that represent all of the symbol probabilities. The symbol probabilities may represent a cumulative probability or the probability of each individual symbol.

Symbol probability table 303 includes memory cells. Model initialization circuit 301 includes a counter circuit. The counter circuit generates memory addresses. The memory addresses are used to load the symbol probabilities from the header into memory cells within symbol probability table 303.

Each probability stored in table 303 corresponds to a most recent history of decompressed output symbols. Each memory address generated by circuit 301 to store a symbol probability in table 303 includes the most recent history of decompressed output symbols that corresponds to that symbol probability. The reason for this is discussed below with respect to how register 306 accesses symbol probabilities from table 303.

Model initialization circuit 301 controls the select input 311 of multiplexer 302 as shown in FIG. 3. Model initialization circuit 301 sends a signal on select input 311 that causes multiplexer 302 to couple output 312 of circuit 301 to symbol probability table 303.

Model initialization circuit 301 then provides memory addresses generated by the counter circuit to table 303 via output 312. The symbol probabilities stored in input data register 305 are loaded into memory cells at the memory addresses provided by model initialization circuit 301.

Decompressor and predictor circuitry 304 also receives the compressed data input stream. Decompressor 304 converts each symbol in the compressed data input stream into one or more decompressed symbols using a decompression algorithm. Decompressor 304 uses the symbol probabilities stored in symbol probability table 303 to decompress the compressed symbols. Further details of an example decompression algorithm are discussed below.

Decompressor 304 outputs a stream of decompressed data symbols. Decoded symbol history register 306 receives the output decompressed data. Decoded symbol history 306 is a shift register that stores the most recent decompressed symbols output by decompressor 304.

After decompressor 304 outputs each decompressed symbol, the decompressed symbol is loaded into shift register 306. Decompression system 300 uses a fixed history of the most recently decompressed symbols stored in register 306 to determine the probability that the next decompressed output symbol to be generated in the decompressed programming stream will be a 1 or a 0.

After model initialization circuit 301 loads the symbols probabilities from the header into table 303, circuit 301 sends a signal to select input 311. This signal causes multiplexer 302 to couple output 313 of shift register 306 to symbol probability table 303.

The decompressed symbols stored in shift register 306 are then used as part of a memory address. The memory address is used to access symbol probabilities from memory cells in table 303. Thus, each set of decompressed symbols stored in register 306 is used to access from memory the probability that the next decompressed symbol is a 1 or a 0.

For example, shift register 306 may store 4 binary symbols at a time. The most recent decompressed symbols output by decompressor 304 may be 0101. Register 306 stores the most recent decompressed symbols received in the configuration data stream. Symbols 0101 are shifted into and stored in register 306 bit by bit. Symbols 0101 are then used as part of the address to access a symbol probability stored in memory in symbol probability table 303.

The symbol probabilities stored in table 303 indicate the probability that the next decompressed symbol will be a particular symbol (e.g., 1 or 0) given the recent history of decompressed symbols stored in register 306. For example, given that the most recent output of decompressor 304 is 0111, the probability that the next decompressed symbol is a 1 may be 0.75. Given this probability, the probability that the next decompressed bit is a 0 is 0.25, because there are only two possible binary symbols, 1 or 0. Therefore, if there are only two symbols, table 303 only needs to output one symbol probability value for each set of the most recent decompressed output symbols.

According to a dynamic decompression model, the symbol probabilities stored in table 303 can be continuously updated during the decompression process according to a recent history of decompression data symbols output by decompression 304.

In one embodiment of the present invention, the addresses to memory in table 303 may be composed using both the history of recent decompressed symbols and a specific compressed input symbol. In this embodiment, table 303 outputs parameters for this specific combination of symbols.

According to the principles of the present invention, a compression algorithm can be used to compress and decompress configuration data for a programmable circuit. For example, arithmetic encoding can be used to compress and decompress configuration data.

Configuration data for a programmable circuit can be encoded using a compression algorithm and decoded using a decompression algorithm. The decompression algorithm reverses the encoding process performed by the compression algorithm. The compression and decompression algorithms can be implemented in software, in hardware, or in any combination of these two.

Figure 4:
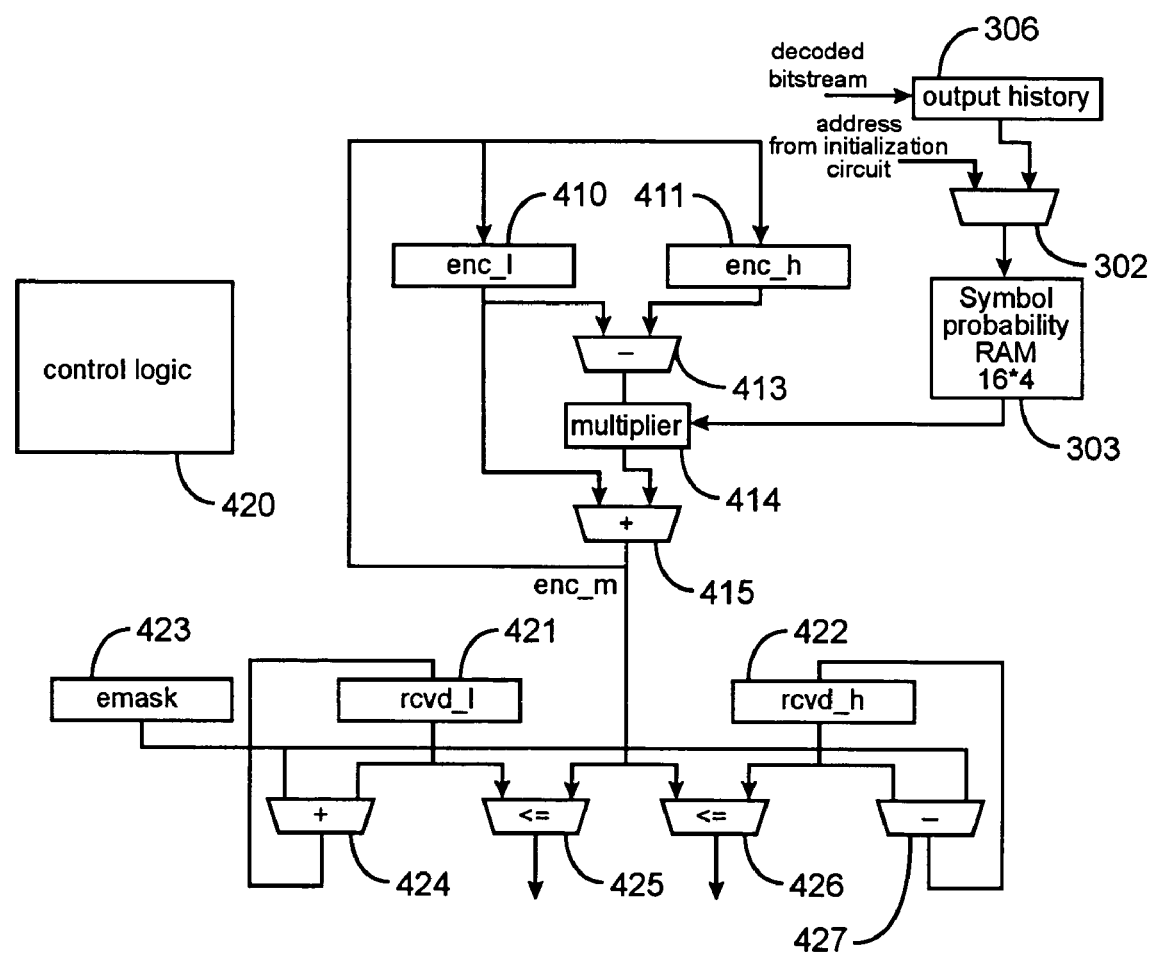
FIG. 4 illustrates details of a data compression and decompression system according to the present invention.

FIG. 4 illustrates a hardware implementation of a decompression system that can be used to decode compressed configuration data according to the present invention. The decompression system includes a model of a compressor (also called an encoder). In FIG. 4, the encoder includes circuits 410-415, and the decoder includes circuits 421-427.

Circuits 413-415 perform functions in an arithmetic compression algorithm. Circuits 424-427 perform functions in an arithmetic decompression algorithm. Control logic 420 provides signals that control the functions performed by circuits 413-415 and 424-427 and determines the decoded bitstream. The circuits of FIG. 4 can be implemented according any number of hardware designs, all of which are within the scope of the present invention.

The decoded bitstream shown in FIG. 4 is the decompressed configuration data output of decompressor 304 (FIG. 3). The most recently decompressed configuration data is stored in decoded symbol history shift register 306, as discussed with respect to FIG. 3. The symbol probabilities are stored in symbol probability table 303.

The decompressed symbols stored in register 306 are used as memory addresses to access symbol probabilities from table 303. Multiplexer 302 controls when address signals from model initialization circuit 301 and shift register 306 are sent to table 303 as discussed with respect to FIG. 3.

A symbol probability from table 303 can be converted into a range between zero and one that corresponds to the symbol probability. For example, assume that there are only two possible symbols (e.g., 0 and 1). If the probability that the next symbol is "0" is 70% (i.e., 0.7), then the range for the symbol 0 is [0.0, 0.7). The probability that the next symbol is "1" must be 0.3, and the range for the symbol 1 is [0.7, 1.0). The bracket "[" means that the number is included, and the parenthesis means that the number is not included. In this example, 0.0 is the low value for symbol 0, and 0.7 is the high value for symbol 0. Similarly, 0.7 is the low value for symbol 1, and 1.0 is the high value for symbol 1.

First, a symbol probability based on the most recent history of decoded symbols is accessed from table 303. Then, high and low values for that symbol probability are calculated. For example, if the probability that the next decompressed symbol is a "0" is 0.5, the low value is 0.0 and the high value is 0.5. In the first iteration of the encoder, the high value for the symbol is stored in enc_h register 411, and the low value for the symbol is stored in enc_l register 410.

Using this information, the compression algorithm can encode the symbol. The basic equation for this compression algorithm is shown in equation (1).

$$enc\_m = enc\_l + (enc\_h - enc\_l) * p_0 \quad (1)$$

In equation (1), the variable $p_0$ is the probability that the next decompressed (or uncompressed) symbol is "0" given a history of most recent decompressed (or uncompressed) symbols (e.g., stored in register 306). Alternatively, $p_0$ can be the probability that the next decompressed symbol is "1" (or any other symbol). The high and low values can be calculated from the symbol probability. Variable enc_l is the low value for the next decompressed symbol. Variable enc_h is the high value for the next decompressed symbol.

Functional circuits 413-415 implement equation (1). According to equation (1), circuit 413 subtracts the low value enc_l for the next decompressed symbol from the high value enc_h for the next decompressed symbol. Multiplier 414 multiplies the result by probability $p_0$. Adder circuit 415 then adds the low value enc_l for the next decompressed symbol to achieve an output value enc_m.

If the next decompressed symbol is a 0, then the output value enc_m is loaded into register 411. In the next iteration of equation (1), the output value enc_m is the value for enc_h, and the value of enc_l remains the same.

If the next decompressed symbol is a 1, then the output value enc_m is loaded into register 410. In the next iteration of equation (1), the output value enc_m is the value for enc_l, and the value of enc_h remains the same.

The output value enc_m is transmitted to two comparators 425-426 in each cycle of the decompression system. These comparisons are discussed below.

Registers 421 and 422 are labeled rcvd_l and rcvd_h, respectively, in FIG. 4. Registers 421 and 422 store the low value and high value, respectively, for a set of symbols received from the compressed input data stream. Control signals from control logic 420 can load values into and shift values through registers 421 and 422.

The register 423 (labeled emask in FIG. 4) maintains a pointer value that points to the position of current the input symbol received from the compressed input data stream. The value stored in e-mask register 423 is shifted to the right by one bit every time a compressed input symbol is received. The value stored in e-mask register 423 is shifted to the left when the state of the receiver is shifted left during each normalization cycle.

The control logic 420 performs encoder normalization cycles as long as required. An encoder normalization cycle is performed when either (a) enc_l is greater or equal to 0.5, (b) enc_h is less than 0.5, or (c) enc_l is greater than or equal to 0.25 and enc_h is less than 0.75. When one of these conditions is satisfied, the pointer value in register 423 is shifted left by one bit position. Also, the values in registers 410, 411, 421, and 422 are shifted left by one bit position when one of conditions (a), (b), or (c) is satisfied. Multiple normalization cycles can occur consecutively.

The present invention also includes techniques for compressing configuration data for a programmable circuit using an encoder. This embodiment is discussed further below. The encoder can use control logic 420 (or other circuitry) to keep track of the number of times that condition (c) above is satisfied in order to monitor the number of deferred output bits. Condition (c) is satisfied when enc_l is greater than or equal to 0.25 and enc_h is less than 0.75. The deferred output bits are represented by n_deferred_output_bits in the C code in the Computer Program Listing Appendix included on the CD_R filed herewith. A counter (not shown in FIG. 4) is used to store the value of n_deferred_output_bits.

Before any of the compressed data is received on the input stream, the value in register 421 is initialized to 0, and the value is register 422 is initialized to 1. As input symbols are received from the compressed input data stream, the values stored in registers 421 and 422 are adjusted based on the received symbols.

Emask register 423 stores a pointer value that points to the bit position of the current input symbol in registers 421 and 422. The pointer value in e-mask is shifted right by one bit position every time an input symbol is received.

When the next compressed input symbol received is a 1, adder circuit 424 increases the low value in register 421 by an amount corresponding to the position of the incoming symbol (rcvd_l=rcvd_l+emask).

For example, if the decompressor receives a 1 on the compressed input data stream as the first input symbol, the pointer value in register 423 is shifted right by one bit position, and adder 424 adds 0.1 in binary to the current value 0 in register 421. Thus, the value in register 421 is 0.1 in binary after the first iteration. If the decompressor receives a 1 on the compressed input data stream as the second input symbol, the pointer value in register 423 is shifted right by one more bit position, and adder 424 adds 0.01 in binary to the current binary value 0.1 in register 421 (assuming no intervening normalization cycles). The value in register 421 is 0.11 in binary after the second iteration.

When the next compressed input symbol received is a 0, subtract circuit 427 reduces the high value in register 422 by an amount corresponding to the position of the incoming symbol (rcvd_h=rcvd_h−emask).

For example, if the decompressor receives a 0 on the compressed input data stream as the first input symbol, the pointer value in register 423 is shifted right by one bit position, and circuit 427 subtracts 0.1 from the current value 1 in register 422. Thus, the value in register 422 is 0.9 (in binary) after the first iteration. If the decompressor receives a 0 on the compressed input data stream as the second input symbol, the pointer value in register 423 is shifted right by one more bit position, and circuit 424 subtracts 0.01 from the current value 0.9 in register 422 (assuming no intervening normalization cycles). The value in register 422 is 0.89 (in binary) after the second iteration.

In each cycle, the values stored in registers 421 and 422 are compared to enc_m. Comparator 425 outputs a signal that indicates whether the value stored in register 421 is greater than or equal to enc_m. Comparator 426 output a signal that indicates whether the value stored in register 422 is less than or equal to enc_m.

The output signals of comparators 425 and 426 are then sent to control logic 420. Control logic 420 analyzes the output signals of comparators 425 and 426 to determine whether to output a 0 or a 1 in the decompressed data configuration stream. If the low value rcvd_l stored in register 421 is greater than or equal to enc_m, control logic 420 outputs a 1 in the decompressed data configuration stream, and enc_m is loaded into register 410. If the high value rcvd_h in register 422 is less than or equal to enc_m, control logic 420 outputs a 0 in the decompressed data stream, and enc_m is loaded into register 411. A new value for enc_m is then computed using equation (1).

The comparisons performed by comparators 425 and 426 are repeated for the compressed input symbols as long as rcvd_l is greater than/equal to enc_m or rcvd_h is less than/equal to enc_m. The decompressor of FIG. 4 can output multiple decompressed symbols for each compressed input symbol. When enc_m no longer satisfies one of the two comparisons, a new compressed symbol is input into the rcvd_l and rcvd_h registers at discussed above. The pointer value in register 423 determines the bit position of the new value added to the value in register 421 or subtracted from the value in register 422.

Figure 5A:
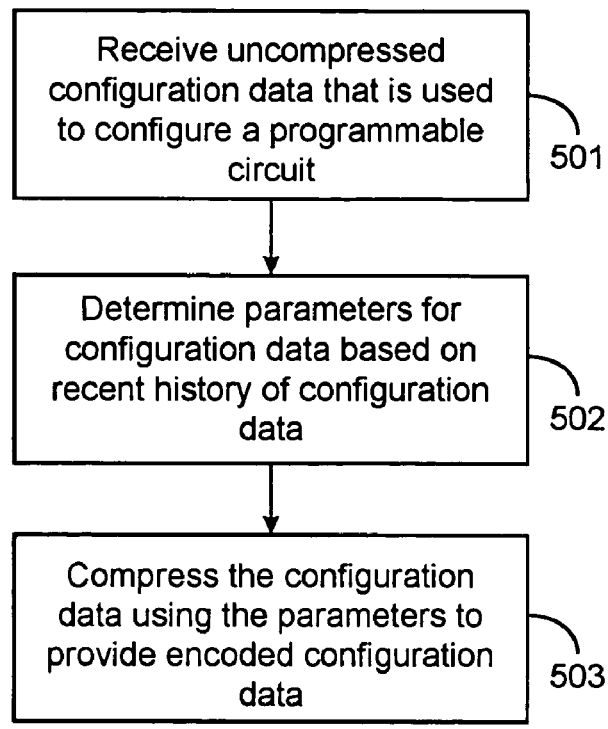
FIG. 5A illustrates a process for compressing uncompressed configuration data for a programmable circuit according to the present invention.

The present invention also includes data compression systems for compressing programmable circuit configuration data. FIG. 5A illustrates a compression process according to the present invention. At step 501, the compression system receives uncompressed configuration data that is used to configure a programmable circuit (e.g., a programmable integrated circuit such as a PLD, an FPGA, a PLA, or a programmable analog circuit).

At step 502, the compression system determine parameters for the configuration data. The parameters can be determined based on a recent history of the uncompressed configuration data to increase compression of the configuration data. The parameters increase compression to reduce the size of the configuration data so that it takes up less memory space.

For example, the compression system can determine symbol probabilities for each symbol (e.g., bit) in the uncompressed configuration data. Each symbol probability indicates the likelihood of receiving a particular symbol in the uncompressed configuration data stream given previously received uncompressed configuration data bits.

After generating the symbol probabilities for all the configuration data, the compression system can store the symbol probabilities in a table (such as table 303). Compression is achieved by transmitting the more probable symbols in fewer bits than the less probable symbols.

For example, a data compression system may receive a "1" on the uncompressed input configuration data stream. The four most recently received bits on the uncompressed input configuration data stream are 0010. The compression system determines the probability of receiving a "1" or "0" as the next input bit on the uncompressed input configuration data stream given that the most recent four data bits are 0010.

The probably of receiving a "1" given that the most recent history is 0010 is increased each time a 1 is received after receiving 0010 and decreased each time a 0 is received after receiving 0010. The compression system updates the probability of receiving a "1" each time the most recent history is 0010. The compression system generates symbol probabilities for all of the other possible recent history of four bits (e.g., 1010, 0011, 1110, etc.). The symbol probabilities are stored in memory (e.g., a table).

Once the symbol probabilities have been determined for the data configuration bits, the data configuration bits are compressed at step 503 using the parameters to save memory space. For example, the compression algorithm can use equation (1) shown above to compress each bit in an input stream of the configuration data. The compression algorithm accesses the symbol probability $p_0$ from memory for each data bit that is compressed. The high and low values (enc_h and enc_l) are determined from the symbol probabilities. The results of equation (1) are the compressed data bits. In one embodiment, a compression system of the present invention uses hardware elements 410-415 and table 303 shown in FIG. 4 to encode configuration data for a programmable circuit.

Using the techniques of present invention, configuration data for programmable circuits can be compressed to reduce the size of the configuration data. The compressed configuration data is then stored in memory. Because the configuration data is compressed, it takes up less memory space.

When it is time to use the configuration data to configure the programmable circuit according to a user design, the compressed configuration data is decompressed using a decompression algorithm that reverses the encoding process of the compression algorithm. By using the compression techniques of the present invention, the amount of memory space need to store configuration data is substantially reduced.

Figure 5B:
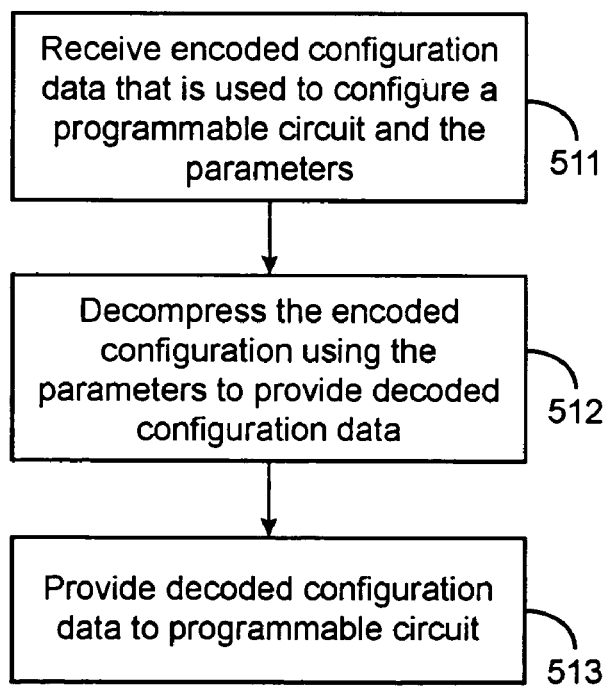
FIG. 5B illustrates a process for decompressing compressed configuration data for a programmable circuit according to the present invention.

FIG. 5B illustrates a process for decompressing encoded configuration data for a programmable circuit, according to the present invention. At step 511, the decompression system receives encoded configuration data that is used to configure a programmable circuit. The decompression system also receives parameters (e.g., symbol probabilities) along with the encoded configuration data.

At step 512, the decompression system decompresses the encoded configuration data using the parameters to provide decoded (decompressed) configuration data. The decompression system can use the decompression techniques described above to decompress the encoded data. At step 513, the decompression system provides the decoded configuration data to the programmable circuit. The configuration data is used to configure programmable circuit elements on the programmable circuit.

The present invention obtains greater data compression and requires less memory by using an arithmetic encoding algorithm. The present invention also obtains greater compression by placing parameters such as symbol probabilities in the data stream as discussed above.

The Computer Program Listing Appendix contains code that implements an encoding and decoding system for binary alphabets according to an embodiment of the present invention. The code in the Computer Program Listing Appendix also determines the probability of a given symbol at a point in the input data stream by using a table that is indexed by the history of the previous N symbols.

Today's high-density PLDs are not only used to implement custom logic with the characteristic quick turn-around, they provide resources that allow them to implement system solutions for the networking, wireless and general high-bandwidth telecommunication applications.

Figure 6:
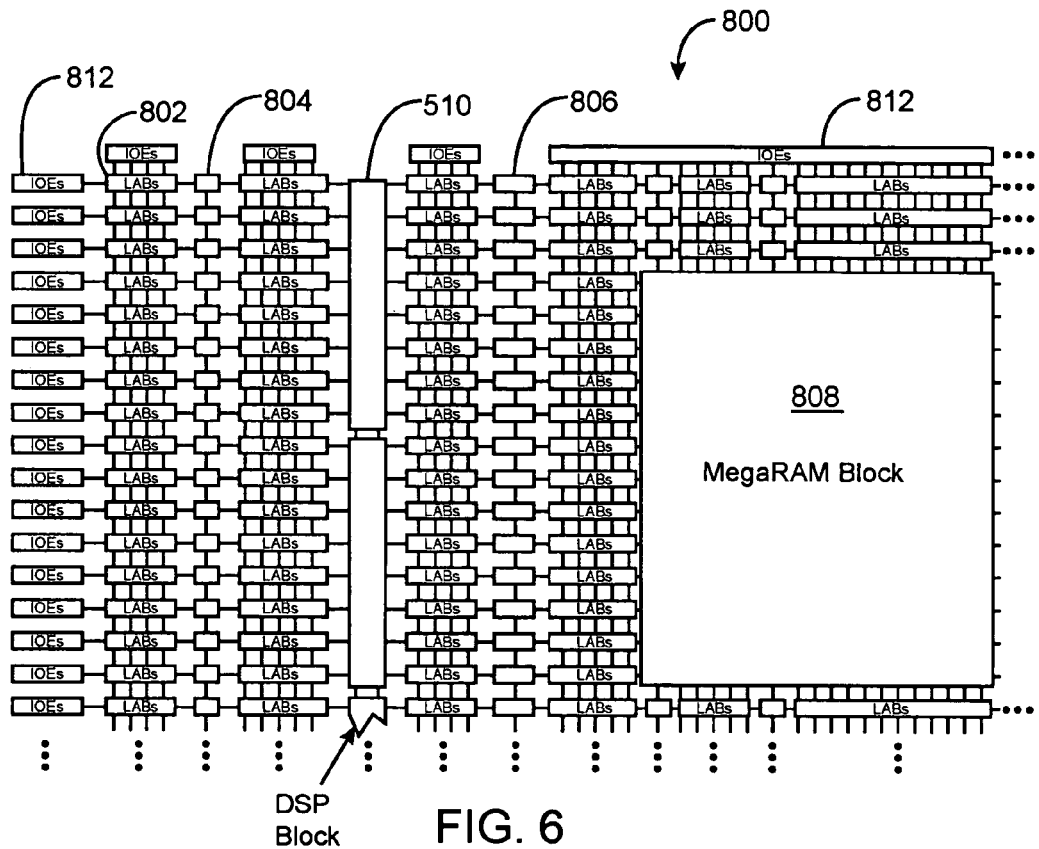
FIG. 6 is a simplified partial block diagram of an exemplary high-density PLD that can be configured with decompressed configuration data according to the present invention.

FIG. 6 is a simplified partial block diagram of an exemplary high-density PLD 800. Decompressed configuration data can be used to configure a programmable circuit such as PLD 800. PLD 800 includes a two-dimensional array of programmable logic array blocks (or LABs) 802 that are interconnected by a network of column and row interconnects of varying length and speed. LABs 802 include multiple (e.g., 10) logic elements (or LEs), an LE being a small unit of logic that provides for efficient implementation of user defined logic functions.

PLD 800 also includes a distributed memory structure including RAM blocks of varying sizes provided throughout the array. The RAM blocks include, for example, 512 bit blocks 804, 4K blocks 806 and a MegaBlock 508 providing 512K bits of RAM. These memory blocks may also include shift registers and FIFO buffers. PLD 800 further includes digital signal processing (DSP) blocks 510 that can implement, for example, multipliers with add or subtract features. I/O elements (IOEs) 812 are located, in this example, around the periphery of the device. It is to be understood that PLD 800 is described herein for illustrative purposes only and that the present invention can be implemented in many different types of PLDs, FPGAs, and the like.

Figure 7:
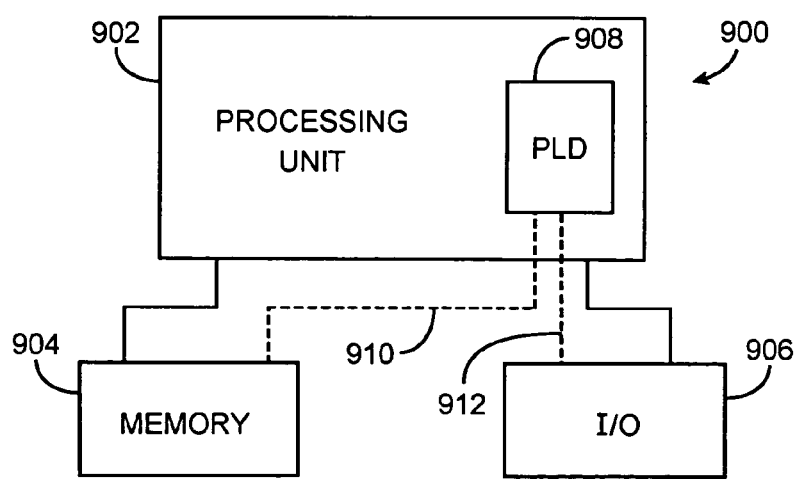
FIG. 7 illustrates a system level diagram including a PLD that can be configured with decompressed configuration data according to the present invention.

The present invention can also benefit systems that use the configuration data compression and decompression techniques of the present invention. FIG. 7 shows a block diagram of an exemplary digital system 900. System 900 may be a programmed digital computer system, digital signal processing system, specialized digital switching network, or other processing system.

Moreover, such systems may be designed for a wide variety of applications such as telecommunications systems, automotive systems, control systems, consumer electronics, personal computers, Internet communications and networking, and others. Further, system 900 may be provided on a single board, on multiple boards, or within multiple enclosures.

System 900 includes a processing unit 902, a memory unit 904 and an I/O unit 906 interconnected together by one or more buses. According to this exemplary embodiment, a programmable logic device 908 is embedded in processing unit 902. PLD 908 may serve many different purposes within the system in FIG. 7. PLD 908 may, for example, be a logical building block of processing unit 902, supporting its internal and external operations.

PLD 908 is programmed to implement the logical functions necessary to carry on its particular role in system operation. PLD 908 may be specially coupled to memory 904 through connection 910 and to I/O unit 906 through connection 912. Processing unit 902 may direct data to an appropriate system component for processing or storage, execute a program stored in memory 904 or receive and transmit data via I/O unit 906, or other similar function.

Processing unit 902 may be a central processing unit (CPU), microprocessor, floating point coprocessor, graphics coprocessor, hardware controller, microcontroller, programmable logic device programmed for use as a controller, network controller, and the like.

Furthermore, in many embodiments, there is often no need for a CPU. For example, instead of a CPU, one or more PLDs 908 may control the logical operations of the system. In an embodiment, PLD 908 acts as a reconfigurable processor, which can be reprogrammed as needed to handle a particular computing task.

Alternately, programmable logic device 908 may itself include an embedded microprocessor. Memory unit 904 may be a random access memory (RAM), read only memory (ROM), fixed or flexible disk media, PC Card flash disk memory, tape, or any other storage means, or any combination of these storage means.

While the present invention has been described herein with reference to particular embodiments thereof, a latitude of modification, various changes, and substitutions are intended in the present invention. In some instances, features of the invention can be employed without a corresponding use of other features, without departing from the scope of the invention as set forth. Therefore, many modifications may be made to adapt a particular configuration or method disclosed, without departing from the essential scope and spirit of the present invention. It is intended that the invention not be limited to the particular embodiment disclosed, but that the invention will include all embodiments and equivalents falling within the scope of the claims.

What is claimed is:

1. A decompression circuit to decompress compressed configuration data, wherein the decompression circuit receives a data input stream that comprises the compressed configuration data and parameters that are selected based on properties of the configuration data to increase compression of the configuration data; and wherein the decompression circuit uses the parameters to decompress the compressed configuration data, and the decompressed configuration data is used to configure a programmable circuit, the decompression circuit comprising:

a first-in-first-out buffer coupled to an input of a decompressor that receives the data input stream and stores data in the data input stream until the data can be decompressed by the decompressor.

2. The decompression circuit of claim 1 wherein the parameters are symbol probabilities observed for the configuration data, the decompression circuit selecting the symbol probabilities based on sets of decompressed symbols recently output by the decompression circuit, and wherein the symbol probabilities are located in a header of the data input stream.

3. The decompression circuit of claim 2 further comprising:

a memory device that stores the symbol probabilities located in the header of the data input stream, wherein the decompression circuit accesses the symbol probabilities from the memory based on the sets of decompressed symbols; and an initialization circuit generating memory addresses that are used to store the symbol probabilities at the memory addresses in the memory circuit.

4. The decompression circuit of claim 1 wherein the decompression circuit is an arithmetic decoder.

5. The decompression circuit of claim 1 wherein the decompression circuit decompresses the compressed configuration data using binary symbols.

6. The decompression circuit of claim 1 wherein the programmable circuit is a programmable logic device on an integrated circuit.

7. A method for decompressing encoded configuration data to provide decoded configuration data that is used to configure a programmable circuit, the method comprising:

receiving a data input stream that comprises the encoded configuration data and parameters;

decompressing the encoded configuration data using the parameters to provide the decoded configuration data, the parameters being chosen and dynamically updated based on recently generated sets of the decoded configuration data to increase compression of the configuration data; and providing the decoded configuration data to the programmable circuit.

8. The method of claim 7 wherein receiving the data input stream further comprises:

receiving the data input at a first-in-first-out buffer that stores data in the data input stream and provides the data to a decompressor.

9. The method of claim 7 wherein the parameters are symbol probabilities for the encoded configuration data that are selected based on the recently generated sets of the decoded configuration data.

10. The method of claim 9 wherein decompressing the encoded configuration data further comprises:

accessing the symbol probabilities from a memory device at addresses that correspond to the recently generated sets of the decoded configuration data.

11. The method of claim 7 wherein decompressing the encoded configuration data further comprises:

decompressing the encoded configuration data using arithmetic decoding.

12. The method of claim 7 wherein the decoded configuration data comprises binary bits.

13. The method of claim 7 wherein providing the decoded configuration data to the programmable circuit further comprises:

providing the decoded configuration data to a programmable logic device on an integrated circuit.

14. A method for compressing configuration data, the method comprising:

receiving a data input stream that comprises configuration data that is used to configure a programmable circuit;

determining parameters for the configuration data in the data input stream, the parameters being chosen and dynamically updated based on a most recent history of the configuration data to increase compression of the configuration data; and compressing the configuration data using the parameters to provide encoded configuration data.

15. The method of claim 14 wherein determining parameters for the configuration data in the data input stream further comprises:

determining symbol probabilities for the configuration data in the data input stream based on a set of the most recent history of the configuration data.

16. The method of claim 15 wherein determining parameters for the configuration data in the data input stream further comprises:

storing the symbol probabilities in a table.

17. The method of claim 14 wherein compressing the configuration data further comprises:

compressing the configuration data using an arithmetic encoder.

18. A decompression circuit for decompressing compressed data, the decompression circuit comprising:

memory that stores symbol probabilities for the compressed data;

first and second registers;

a first subtracter circuit coupled to the first and the second registers;

a multiplier circuit with a first input coupled to an output of the first subtracter circuit and a second input coupled to the memory;

a first adder circuit coupled to an output of the multiplier circuit, wherein an output of the first adder circuit is coupled to inputs of the first and second registers;

first and second comparator circuits, wherein the first and second comparator circuits each have first inputs coupled to the output of the first adder circuit;

third and fourth registers, wherein the first comparator circuit has a second input coupled to the third register, and the second comparator circuit has a second input coupled to the fourth register;

a second adder coupled to the third register; and a second subtracter circuit coupled to the fourth register.

19. The decompression circuit of claim 18 further comprising:

a fifth register coupled to the second adder circuit and the second subtracter circuit, the fifth register storing a pointer that points to the bit position in the third and fourth registers.

20. The decompression circuit of claim 18 further comprising:

control logic circuitry that outputs decompressed data in response to results of comparisons performed by the first and second comparator circuits, wherein the decompression data is provided as configuration data for a programmable circuit.

21. An integrated circuit comprising:

a decompression circuit to decompress compressed configuration data; and a plurality of programmable logic elements, configurable using the decompressed configuration data to implement user-defined logic functions, where the decompression circuit comprises:

a counter to provide a first portion of each of a plurality of addresses;

a memory to receive the addresses and provide symbol probabilities; and a decompressor to receive the compressed configuration data and symbol probabilities and to provide decompressed configuration data, wherein portions of the decompressed configuration data are provided as a second portion of each of the plurality of addresses.

22. The integrated circuit of claim 21 wherein the decompression circuit further comprises a first-in-first-out memory to receive the compressed configuration data and to provide the compressed configuration data to the decompressor.

* * * * *